(12) United States Patent
Harrand

(10) Patent No.: US 7,549,109 B2
(45) Date of Patent: Jun. 16, 2009

(54) MEMORY CIRCUIT, SUCH AS A DRAM, COMPRISING AN ERROR CORRECTING MECHANISM

(75) Inventor: Michel Harrand, Saint Egreve (FR)

(73) Assignee: STMicroelectronics SA, Montrouge (FR)

( * ) Notice: Subject to any disclaimer, the term of this patent is extended or adjusted under 35 U.S.C. 154(b) by 729 days.

(21) Appl. No.: 11/301,635

(22) Filed: Dec. 13, 2005

(65) Prior Publication Data

US 2006/0184858 A1 Aug. 17, 2006

(30) Foreign Application Priority Data

Dec. 15, 2004 (FR) .................................. 04 13334

(51) Int. Cl.
*G11C 29/00* (2006.01)
(52) U.S. Cl. ...................................... 714/763; 714/718
(58) Field of Classification Search ................. 714/763, 714/718
See application file for complete search history.

(56) References Cited

U.S. PATENT DOCUMENTS

| | | | | |
|---|---|---|---|---|
| 4,969,148 A * | 11/1990 | Nadeau-Dostie et al. | .... | 714/718 |
| 5,117,393 A * | 5/1992 | Miyazawa et al. | .......... | 714/718 |
| 5,293,347 A | 3/1994 | Ogawa | ................... | 365/230.01 |
| 5,680,365 A | 10/1997 | Blankenship | .......... | 365/230.05 |
| 5,751,638 A * | 5/1998 | Mick et al. | ............. | 365/189.04 |
| 5,798,656 A * | 8/1998 | Kean | ........................... | 326/39 |
| 5,831,448 A * | 11/1998 | Kean | ........................... | 326/41 |
| 6,018,817 A * | 1/2000 | Chen et al. | .................. | 714/762 |
| 6,631,441 B2 | 10/2003 | Harrand et al. | .............. | 711/105 |
| 6,675,256 B1 | 1/2004 | Harrand et al. | .............. | 711/105 |
| 6,701,482 B2 * | 3/2004 | Salvi et al. | ................... | 714/786 |
| 6,874,111 B1 * | 3/2005 | Adams et al. | ............... | 714/733 |

(Continued)

FOREIGN PATENT DOCUMENTS

EP 0 306 726 A2 3/1989

(Continued)

OTHER PUBLICATIONS

Chang, T-S., et al., "Embedded Memory Module Design for Video Signal Processing," in *Proceedings of the Signal Processing Society Workshop on VLSI Signal Processing VIII*, Sakai, Japan,, Sep. 16-18, 1995, pp. 501-510.

*Primary Examiner*—Mujtaba K Chaudry
(74) *Attorney, Agent, or Firm*—Lisa K. Jorgenson; Robert Iannucci; Seed IP Law Group PLLC

(57) ABSTRACT

A dual port memory circuit has a memory plane including first and second modules each constituted of an array of memory cells arranged in columns and rows, each row of the memory plane allowing storage of a page of words, each word of the page being identified by an address organized according to a hierarchical division defined by (@MSB, row address, column address), with @MSB identifying a particular module among the n modules. The circuit comprises first and second address buses, and first and second data buses used for reading and writing the modules, respectively. For each memory module, there is provided a multiplexer having two inputs connected to both address buses. The multiplexer output is connected to a row decoder and to first and second column decoders corresponding to the first and second data buses. Each multiplexer is controlled to allow writing and simultaneous reading of two distinct modules.

25 Claims, 4 Drawing Sheets

U.S. PATENT DOCUMENTS

| | | | |
|---|---|---|---|
| 7,076,714 B2 * | 7/2006 | Cook et al. | 714/742 |
| 7,127,668 B2 * | 10/2006 | McBryde et al. | 714/801 |
| 2002/0162069 A1 * | 10/2002 | Laurent | 714/763 |
| 2003/0204795 A1 * | 10/2003 | Adams et al. | 714/763 |
| 2004/0264279 A1 * | 12/2004 | Wordeman et al. | 365/230.05 |
| 2005/0185492 A1 | 8/2005 | Harrand | 365/23.05 |

FOREIGN PATENT DOCUMENTS

| | | |
|---|---|---|
| GB | 2 289 779 A | 11/1995 |
| JP | 55-55499 | 4/1980 |

* cited by examiner

MEMORY CIRCUIT, SUCH AS A DRAM, COMPRISING AN ERROR CORRECTING MECHANISM

BACKGROUND OF THE INVENTION

1. Field of the Invention

The present invention relates to the field of memories and more particularly to dynamic random access memories (DRAM).

2. Description of the Related Art

Dynamic DRAM memories are very popular because of their large storage capacity. On the other hand, they require periodic refresh and, furthermore access to DRAM is much slower than access to static memories.

There have been attempts to increase the bandwidth of dynamic memories. To this end, a known technique consists in associating to the memory plane buffers or memories controlled by an adapted memory controller.

U.S. Pat. No. 6,675,256 entitled "Fast DRAM Control Method and Adapted Controller" by M. Harrand, describes a method and a memory controller for controlling a dynamic memory comprising a memory plane made up of a memory cell array and at least two buffers.

U.S. Pat. No. 6,631,441 by M. Harrand and D. Doise, describes a fast DRAM memory structure comprising a memory plane associated with at least two buffers for accessing the memory plane and for reading or writing the memory.

U.S. Published Patent Application No. 2005/0185492 entitled "Dynamic Random Access Memory Having at Least Two Buffer Registers and Method for Controlling Such a Memory", filed Dec. 21, 2004 by the owner of this application, teaches how to add an error correcting system that is absolutely transparent for the user. In particular, a continuous data stream is maintained even when writing words, or parts of a word, that are shorter than the data set to which the error correcting code is applied.

Thus, this error correcting system makes it possible to significantly improve reliability of the memory and makes it less sensitive to electromagnetic disturbances that are sources of error. Reliability improvement is such, that this technique can even be considered as an alternative to expensive burn-in methods, in particular thermal ones.

The architecture described in U.S. Published Patent Application No. 2005/0185492 allows to increase bandwidth only when burst-accessing memory within a single page of data read in the memory matrix. An uninterrupted data stream on the data bus is then obtained, thus allowing an optimal bandwidth.

On the other hand, when accessing the memory successively at different pages, the data stream is stopped, thus slowing down memory performances.

BRIEF SUMMARY OF THE INVENTION

One embodiment of the present patent application solves the problem of writing words that are shorter than the data group protected by an error-correcting code in the case of a random access only memory (with no bursts). The embodiment is a dynamic memory with purely random access, identical to that of a SRAM, equipped with an error-correcting code system, which permanently ensures maximum bandwidth. In particular, it makes it possible to get a continuous stream of address data, even when writing words, or parts of word, that are shorter than the data group protected by an error-correcting code.

This further allows to reduce memory size, thanks to the use of error-correcting codes (ECC) on words whose size is larger than the system that is using the memory: indeed, the longer the word on which an ECC code is applied the lower the amount (in bits) of the code.

In addition, one of the problems also solved by one embodiment of the present invention consists of the realization of a memory circuit for dual port operation having a size comparable with a single port memory.

One embodiment of the present invention is a new structure for a single port dynamic memory having an error-correcting system, which guarantees a maximum bandwidth under all conditions.

Another embodiment of this invention provides an architecture for a DRAM memory that comprises an error-correcting code system while allowing a very simple interface, of the SRAM type.

One embodiment of the invention provides a dual port memory circuit having a memory plane comprising at least a first module and a second module (1-1, 1-*n*), each composed of an array of memory cells arranged in columns and rows, each row of said memory plane allowing storage of a page of words, each word of said page being identified by an address organized according to a hierarchical division defined by (@MSB, row address row, address column), with @MSB identifying a particular module among said n modules. The circuit comprises a first address bus and a second address bus, and a first data bus and second data bus used respectively for reading and for writing in said modules. For each memory module, there is a multiplexer whose both inputs are respectively connected to both address buses of the dual port memory. The output of the multiplexer is connected to a row decoder (2-1, 2-*n*) and also with a first column decoder and a second column decoder corresponding to first and second data buses. Each multiplexer is controlled so as to allow writing and simultaneous reading of two distinct modules, in the following way:

- if the MSB address of said first of address bus (41) is equal to the address of said module corresponding to said multiplexer (4-1, 4-*n*) and a read/write control is present on said first bus, then the multiplexer outputs the row and column addresses and said read/write control of said first bus
- otherwise, if the MSB address of said second address bus (51) is equal to the address of said module corresponding to said multiplexer (4-1, 4-*n*) and a read/write control is present on said second bus, then the multiplexer (4-1, 4-*n*) outputs the row and column addresses of said second bus; and
- in the contrary case, said multiplexer outputs inactive read/write controls.

A memory circuit that allows two simultaneous read and write operations, in two distinct modules is thus obtained, by means of a memory circuit whose size is comparable with a single port memory circuit.

This memory circuit—that operates quite similarly to a dual port memory—may be used for a large variety of applications.

In particular, in a preferred embodiment, a single port memory circuit comprising an integrated error-correcting mechanism can be realized. To this end, one of both address buses and one of both data buses is assigned to the error correcting mechanism in order to obtain, without losing speed, a read operation in one of said modules and rewriting—possibly after computation of a new error-correcting code, in one of the modules.

In a preferred embodiment, addressing within each of said memory modules is organized following a hierarchical division @GROUP, @LSB, with @GROUP identifying a particular group of words within said particular module and @LSB defining the position of a word in said group of words, and an error-correcting code is applied to that group of words.

Preferably, the memory circuit comprises:

an error correcting system applied to a subset of said page, said subset making up a group of words;

a cache memory for storing a group of words, after its possible modification, at an address identical to the @GROUP address originally used for storage in said module, but for one bijective relation;

at least a first, a second and a third buffer, respectively noted S, T, and U hereinafter, allowing to temporarily transfer the contents of said cache memory for an @GROUP address corresponding to a next cycle in order to allow a next write access to said address;

circuits for transferring said at least first, second or third buffer, at the earliest during a successive cycle, to one of said modules that is not being read.

As a result, at each cycle it becomes possible to read and write, to cache memory as well as to main memory, in spite of the fact that memory modules are simply of single port type.

This is due to the fact that read and write access always take place in different modules. Only a few additional buffers are needed to allow temporary transfer of cache memory contents when absolutely necessary.

Preferably, the bijective relation is the unit relation and the memory circuit comprises a memory (known as a TAG memory), for storing, for each @GROUP address of a word within one of said modules:

data determining whether the address corresponds to a valid word group of the cache, namely data having been read in one of said modules of the main memory, modified and not yet rewritten in this module;

data identifying a module among said modules;

data identifying which of said first or second cache memory is used for storing said valid data, when the cache is composed of 2 single port memories, similarly to the main memory, and as will be described later on.

Thus, with this fast and nevertheless small sized memory, it is possible to manage access to both caches, and to buffers S, T and U to ensure the following operating conditions, allowing uninterrupted data flow for the user:

1. only one read operation and only one write operation can be carried out in the main memory, but in distinct modules. Similarly, both caches allow only one read operation and only one write operation.

2. new data extracted from cache should not be written to buffers S, T or U when the buffers are not empty and cannot be purged by transfer to the main memory.

The invention is particularly adapted for realizing a DRAM type memory.

BRIEF DESCRIPTION OF THE DRAWINGS

Other features, objects and advantages of the invention will appear when reading the following description and drawings, only given by way of nonrestrictive examples. In the accompanying drawings.

DETAILED DESCRIPTION OF THE INVENTION

Figure 1:
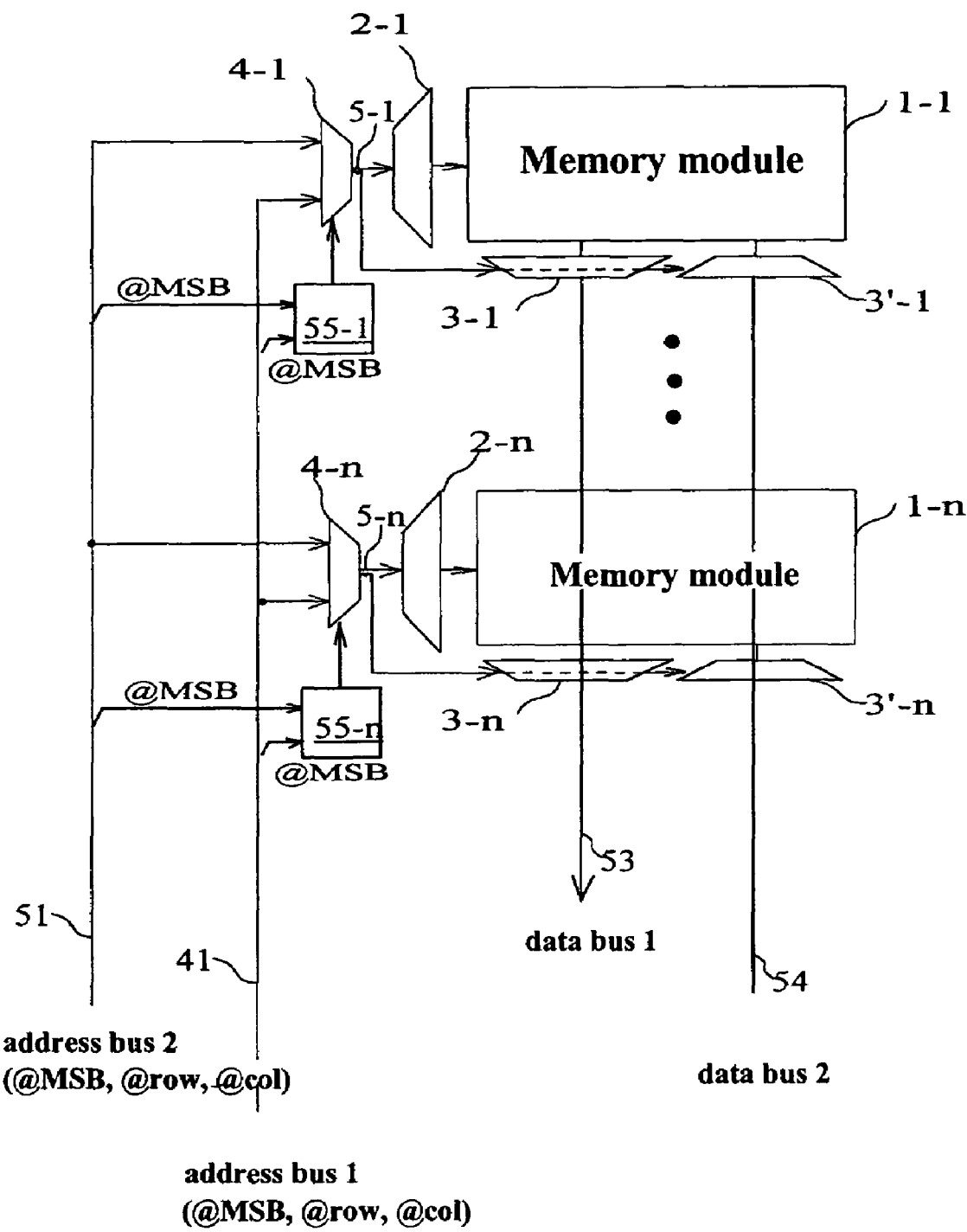
FIG. 1 illustrates a preferred embodiment of a DRAM-type dual port memory having a particularly reduced size.

FIG. 1 illustrates the general architecture of a very small dynamic dual port memory, in accordance with the present invention.

The memory shown in FIG. 1 comprises a set of n modules 1-1 to 1-$n$ (n being an integer, for example 2, 4, 8, 32, 64 . . . ) of which only modules 1-1 and 1-$n$ are shown on the figure. Generally, each module 1-1 (resp. 1-$n$) comprises a memory plane—single port type—which is composed of memory cells and is associated with a row decoder 2-1 (resp. 2-$n$) and with a set of two column decoders 3-1 and 3'-1 (resp. 3-$n$ and 3'-$n$), the first decoder being used for reading and the second one for writing. Each memory cell is located at the intersection of a row (or line) and a column (or bit line). Amplifiers (not shown in FIG. 1) allow access to the memory, for reading, writing or refreshing.

Each line of said memory plane allows to store a page of words that is identified by an address organized according to a hierarchical division defined by (@MSB, row address, column address), with @MSB identifying a particular module among said n modules The division of the memory space into different modules 1-1 to 1-$n$ makes it possible to reduce the length of the bit line and, consequently, to reduce its capacitance that should preferably be maintained not much higher than memory cell capacitance [in practice, about 10 to 20 times higher . . . ], which memory cell capacitance, as is well known, tends to decrease as dynamic memory density increases. To keep the bit line capacitance value small enough, a sufficient number of modules 1-1 to 1-$n$ should be provided.

Control of row and column decoders is carried out in a traditional way by means of traditional control signals for a DRAM memory that are not shown in FIG. 1. As it is known, column decoders 3-1 to 3-$n$ and 3'-1 to 3'-$n$ are controlled by column address strobes (CAS), column address (CAD) and read/write signals (R/W). Row decoders are controlled by a row address strobe and row address signal.

The memory circuit of FIG. 1 comprises a first address bus 41 and a second address bus 51, and first and second data buses 53 and 54 that are used for reading and writing modules 1-1 to 1-$n$, respectively.

Data bus 53 is connected to the output of all read column decoders 3-1 to 3-$n$ by a 3-state connection system, and data bus 54 is connected to the data inputs of all writing column decoders 3'-1 to 3'-$n$.

As will be explained, the organization of the memory circuit allows simultaneous reading and writing in two different modules.

To this end, a multiplexer (4-1, 4-$n$) that has a first input and a second input connected with the first and the second address buses (41, 51) respectively, is associated to each module (1-1, 1-$n$).

Row decoder 2-$i$ (with i=1 to n) of a particular memory module 1-$i$ has an input that is connected to the output of a corresponding multiplexer 4-$i$ in order to receive the address part from this output corresponding to the row address.

The first column decoder 3-$i$ corresponding to memory circuit 1-$i$ has an input connected to the output of multiplexer 4-$i$ in order to receive the column address. Similarly, second column decoder 3'-$i$ also receives the column address output from multiplexer 4-$i$.

To each multiplexer 4-$i$ is associated control logic 55-$i$, represented by elements 55-1 and 55-$n$ in FIG. 1, and receiving the @MSB address part from both address buses. Elements 55-1 with 55-n allow to select one of address buses 41 or 51 according to the following logic:

If the MSB address of said first address bus 41 is equal to the address of said module corresponding to said multiplexer 4-i and a read/write control is present on said first bus, then multiplexer 4-i outputs column and row addresses and said read/write control of said first bus.

If not, if address MSB of said second address bus 51 is equal to the address of said module corresponding to that the multiplexer 4-i and a read/write control is present on said second bus, then the multiplexer 4-i generates at output the addresses of columns and rows of said second bus and said read/write control of said second bus; and In the opposite case, said multiplexer outputs inactive read/write controls.

The memory circuit of FIG. 1 has the advantage of having a reduced size since it can be compared, excluding multiplexers, to the size of a single port memory circuit. On the other hand, thanks to this memory circuit, extended operation, close to the operation of a dual port memory is obtained, since a read operation and a write operation can be simultaneously realized in two distinct memory modules.

Thus, memory circuit bandwidth is significantly increased and this circuit can have many industrial applications.

In particular, as will be seen now, the memory circuit of FIG. 1 is particularly adapted to the realization of a single port memory circuit having an integrated error-correcting mechanism. To this end, one of the address ports and one of the two data ports are assigned to the error-correcting mechanism and thus, a particularly powerful memory circuit is obtained without losing speed.

Figure 2:
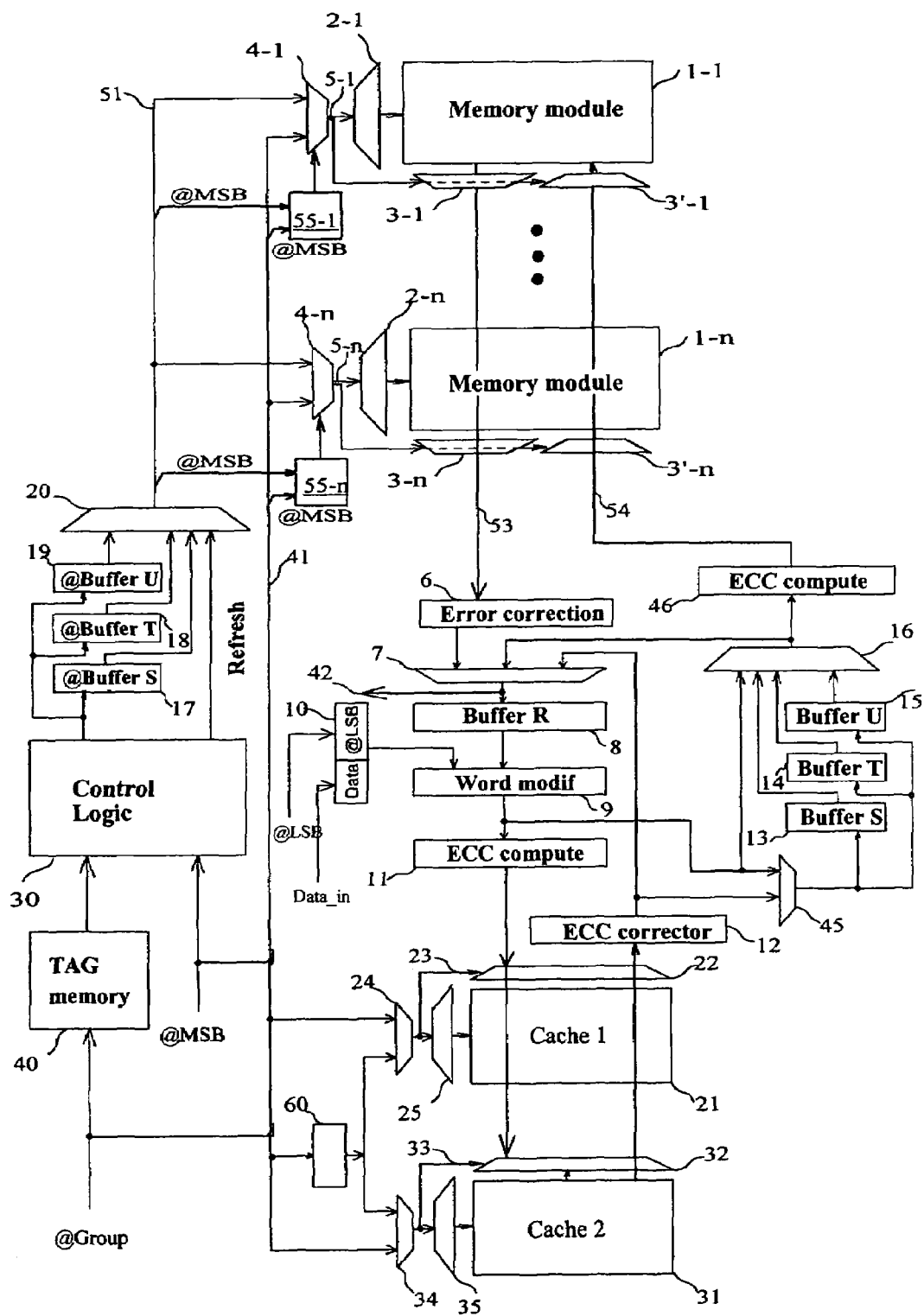
FIG. 2 illustrates a preferred embodiment of a DRAM-type single port memory, comprising an error-correcting mechanism in accordance with the present invention.

FIG. 2 illustrates a preferred embodiment of a memory circuit according to the present invention, having an error-correcting mechanism.

Memory modules 1-1 to 1-n are identical to those in FIG. 1 and, for clarity's sake, they bear the same reference number as in FIG. 1. Thus, for each memory module 1-i (with i=1 to n) there is provided a row decoder 2-i, first and second column decoders 3-i and 3'-i, a multiplexer 4-i and its associated control logic 55-i.

First address bus 41 is assigned to the user interface of the memory circuit while second address bus 51 is used, as will be shown hereinafter in more detail, by an error-correcting mechanism for rewriting in a memory module distinct from the one that is used for a read operation.

During a reading phase on data bus 53, data bus 54 is used to carry out a write operation in another module, possibly after corrections and computation of a new error-correcting code.

In the circuit of FIG. 2, address bus 41 carries the system address (@WORD) from the external interface of the memory.

Address bus 51 is connected to the output of multiplexer 20, controlled by control logic 30, and having four input buses. A first bus receives the address value (@Buffer S) stored in buffer 17, while a second bus receives the address value (@Buffer T) stored in buffer 18. A third bus receives the address value (@Buffer U) stored in buffer 19 and finally a fourth bus receives a refresh address value provided by control logic 30 for memory module refresh cycles. Generally, the inputs and outputs of all modules and buffers that will be described hereafter are composed of buses that will be designated as "input" or "output", according to cases.

To better understand this description, an example of a memory architecture comprising 32 modules storing 128 pages of 1024 information bits (and some additional error-correcting code bits) each, will now be considered. Each page is in turn divided into eight subsets or word groups of 128 bits, which in turn are broken down into 4 words of 32 bits each.

Thus, a memory of 4 Mbits can be realized. A triple hierarchical division of the address carried by address bus 41 is realized, to allow embedding of the error correcting mechanism at the level of a word group. The most significant bits (or MSB) of the address define the module i (with i=1 to n) that is concerned with the 32-bit data to read or write, while the least significant bits (LSB) determine a particular page stored within said module i (decoded by row decoder 2-i), a group of words, and, regarding the last LSB bits, the place of the 32 bit word within the 128-bit group of words. The place of a 32-bit word within a particular group of words is therefore defined, in this example, by the last 2 bits. In the figure, these bits are noted @LSB.

Therefore, the complete address of a word @WORD breaks up into (@MSB, @GROUP, @LSB) with:
in our example, @MSB consisting of 5 bits defining a module among 32 modules;
@GROUP consisting of 10 bits defining a 128-bit group of words within the considered module (said module supposedly containing 1024 word groups at most);
@LSB consisting of 2 bits defining the position of a 32-bit word within a 128-bit group of words.

It should be noted that @GROUP together with @LSB (i.e., 12 bits) form the address part carried by bus 41 that corresponds to the column and row addresses for row decoders 2-i and first and second column decoders 3-i and 3'-i. For clarity's sake, hereinafter distinction between the row address part and the column address part will not be considered anymore, but more precisely we will distinguish between @GROUP and @LSB, which is at the heart of the error correcting mechanism.

Thus, the organization of addressing within the memory can be represented by an @MSB address defining a module within n modules (n=32 in our example), an @GROUP address defining a group of words (protected by an ECC code) inside a module, and an @LSB address which is the address of a word within a considered group of words.

It should be noted that this system is also applicable to the writing of very short words, such as bytes, and even of bits, although it would be seem hardly possible to protect bytes, or bits, with an ECC code.

The @MSB part of bus 5-i—output of multiplexer 4-i—allows to validate access to said module i by means of a decoding logic (not shown).

At the output of column decoders 3-1 to 3-n, the data read from memory—i.e., a word group of 128 information bits (to which are added a few error-correcting code bits according to the code employed)—is transmitted via the first data bus 53 to the input of an error-correcting block 6 that checks word group integrity at the output of the main memory and, if needed, makes corrections. The structure of such a correcting block is well known by people qualified in the art and therefore will not be further described. In particular, a Hamming code could be used, for its simplicity.

Block 6 comprises a 128-bit output bus that is connected to a first input of multiplexer 7 having also a second input and a third input. The output of multiplexer 7 provides the value of data D_out to bus 42 and is also connected to the input of buffer register 8 called "Buffer R" whose function consists in storing the 128-bit group of words that is to be modified within a considered 1024-bit page. Buffer 8 has an output (a 128-bit bus) that is connected to a first input of block 9, noted "MODIF WORD". This block comprises a second input connected to the output of buffer register 10 in which is stored complex information combining a value Data_In of the word (32 bits) to modify, and the @LSB part of the address defining the position of the word to be modified within the 128-bit group of words. As previously mentioned, in our example of an architecture with 32 modules, the @LSB part is composed of the last 2 bits. Block 9 uses this information to modify, where appropriate within the 128-bit group of words, the 32 bits corresponding to the word that is to be modified.

Block 9 comprises an output connected to a first input of multiplexer 45 and to a first input of multiplexer 16 and to an input of error-correcting code computation block 11, which computes the new correction code resulting from the modification operated by block 9. As previously, the structure and operation of such a module will not be further described, as they are well known by people qualified in the art.

It should be noted that in the example described in FIG. 1, block 9 is placed downstream from buffer 8. It is a particular example of realization and the position of word modifier block 9 could be changed and placed upstream of buffer 8 so that the buffer stores the word group value, once modification is complete.

The output of block 11 is connected to the column decoders of a cache memory 21-31.

Cache memory 21-31 is organized in two single port-type memory modules, respectively 21 and 31, each having a memory plane whose structure is similar to that of modules 1-1 to 1-$n$ of the main memory. As a result, in each cache 21 or 31, any group of words originally read (after modification by block 9) can be stored in one of modules 1-1 to 1-$n$ of the main memory, at an address defined by a bijective relation relative to the @GROUP address part defined previously.

In a preferred embodiment, cache storage at an address that is exactly the same one as address @GROUP can be considered. People qualified in the art will be able to use a less direct bijective relation, like an inversion of bits.

In our example, each memory plane therefore allows to store 128 pages of 1024 bits each (plus error correction bits), being understood that determination of the module (21 or 31) in which a particular word will actually be stored will be carried out in accordance with the algorithms and processes that are described hereafter.

Returning to FIG. 2, it can be observed that caches 21 and 31 are associated to row decoders, 25 and 35, and column decoders 22 and 32, respectively. Column decoders allow to extract a 128-bit group of words within a 1024-bit page. As for the row decoders of the main memory, row decoders 25 (resp. 35) and column decoders 22 (resp. 32) are associated to a multiplexer 24 (resp. 34), two inputs of which are respectively connected to the @GROUP part of bus 41 and to the output of a buffer register 60. Thus, the two row decoders can, under control of control logic 30, receive as input either the address value carried by bus 41 (@GROUP), or an address value stored in buffer 60.

The input of buffer 60 is connected to the @GROUP part of bus 41, so that buffer 60 contains a preceding value of bus 41.

It will be noted that the number of two memory planes 21 and 31 is independent of the number $n$ of memory modules 1-1 to 1-$n$ that make up the main memory. On the other hand, it is observed that both single port memory planes can opportunely be replaced by a single dual port cache memory allowing simultaneous read and write access.

During reading, cache memory 21-31 provides a value that is transmitted via column decoders (22 and 32) to an input of a second error correcting block 12, which checks the integrity of the read group of words and, if necessary, corrects it. Block 12 has an output that is transmitted to the second input of multiplexer 7 and to a second input of multiplexer 45, which has an output that is connected to the input of three buffer-registers 13, 14 and 15, respectively noted S, T and U These three buffers each have an output (a bus) that is respectively connected to a second, a third and a fourth input of a multiplexer 16 controlled by control logic 30.

Multiplexer 16 has an output bus that is connected to a third input of multiplexer 7 and to the input of an ECC computation block 46, whose output is connected to the second data bus 54 of column decoders 3'-1 and 3'-$n$ of the main memory, in order to allow a 128-bit group of words to be rewritten in main memory.

Lastly, the memory architecture is completed by a small size memory 40, known as a TAG memory, that has an address bus connected to bus 41 and a data bus connected to control logic 30. This memory should be very fast, because it is used to store management information for caches 21-31 and buffers S, T and U that are used for memory operation. More precisely, for each address of a 128-bit group of words stored in one of caches 21-31, TAG memory 40 is organized to store information comprising the address of the concerned module (i.e., 5 bits for a group of 32 modules), 1 bit to define in which of caches 21 or 31 the group of words is stored and 1 additional bit to determine whether data is valid. Moreover, for each buffer R, S, T, and U, validity information on buffer contents and module address of data contained therein are provided. As can be seen, it is thus possible to use a memory that, although fast, nevertheless remains small and is consequently cheap to make. In our example a 1024×7 memory could be used for the TAG memory, with 4×6 more bits for information corresponding to buffers R, S, T, and U.

Generally, all control signals that are necessary to the operation of multiplexers 4-1, 4-$n$, 7, 16, 20, 24, 34, 16 etc . . ., and for the various buffers are generated by control logic 30 in accordance with algorithms that will be described hereafter. The design of such a control logic, which follows a state machine logic, is well-known by people qualified in the art will therefore not be further detailed.

Operation of the new memory architecture will now be described. Generally, the interface between memory and inputs/outputs are ensured by means of a system interface that allows to receive memory access requests. These requests comprise—from MSB to LSB—five @MSB address bits defining a module address (1 among 32 modules), completed by page address within a given module (1 page among 128 pages), word group address (1 among 8) within the page and word address (32 bits among the 128 bits). Hereinafter, the page address and word group address are together noted @GROUP.

As in U.S. Published Patent Application No. 2005/0185492 previously mentioned, the memory comprises an error-correcting code system—implemented by blocks 6, 11 and 12—that is applied directly on a 128-bit group of words instead of being applied on a 32-bit word, in order to reduce the memory space occupied by the error-correcting code. The system even makes it possible to write bytes individually, or even bits, without losing any time, although the ECC is applied to 128-bit words.

In our example, each 1024-bit page comprises eight groups or word groups of 128 bits that are each associated with an 8-bit error-correcting code.

Each memory module 1-1 to 1-$n$ is of the single port type, as previously mentioned. On the other hand, memory module multiplicity and the fact of using two address buses, respectively transmitted to the first input and the second input of each multiplexer 4-1 to 4-$n$, and 2 data buses, one for reading and the other for writing, thus makes it possible to read the contents of a module while writing in another module. On the other hand, as can be noted about the architecture, it is not possible to carry out two reads or two writes in the same module, each module being a single port module.

Memory Write Access

Write access to the memory will be now more particularly described. For this purpose, in order to make the figures and illustrative C code (listed below) easier to read, the following conventions are adopted:

M=@MSB and
A=@GROUP
TagCache(A) is the value X, Y or Null (2 bits) stored in TAG memory 40 indicating in which of the 2 caches data is stored, and
TagModule(A) the module to which data belongs at this address, this value being also stored in TAG memory 40,
CacheX(A) corresponds to the data stored in cache X, at address A and
CacheY(A) corresponds to the data stored in the cache Y (resp. Y) at address A.

Figure 3:
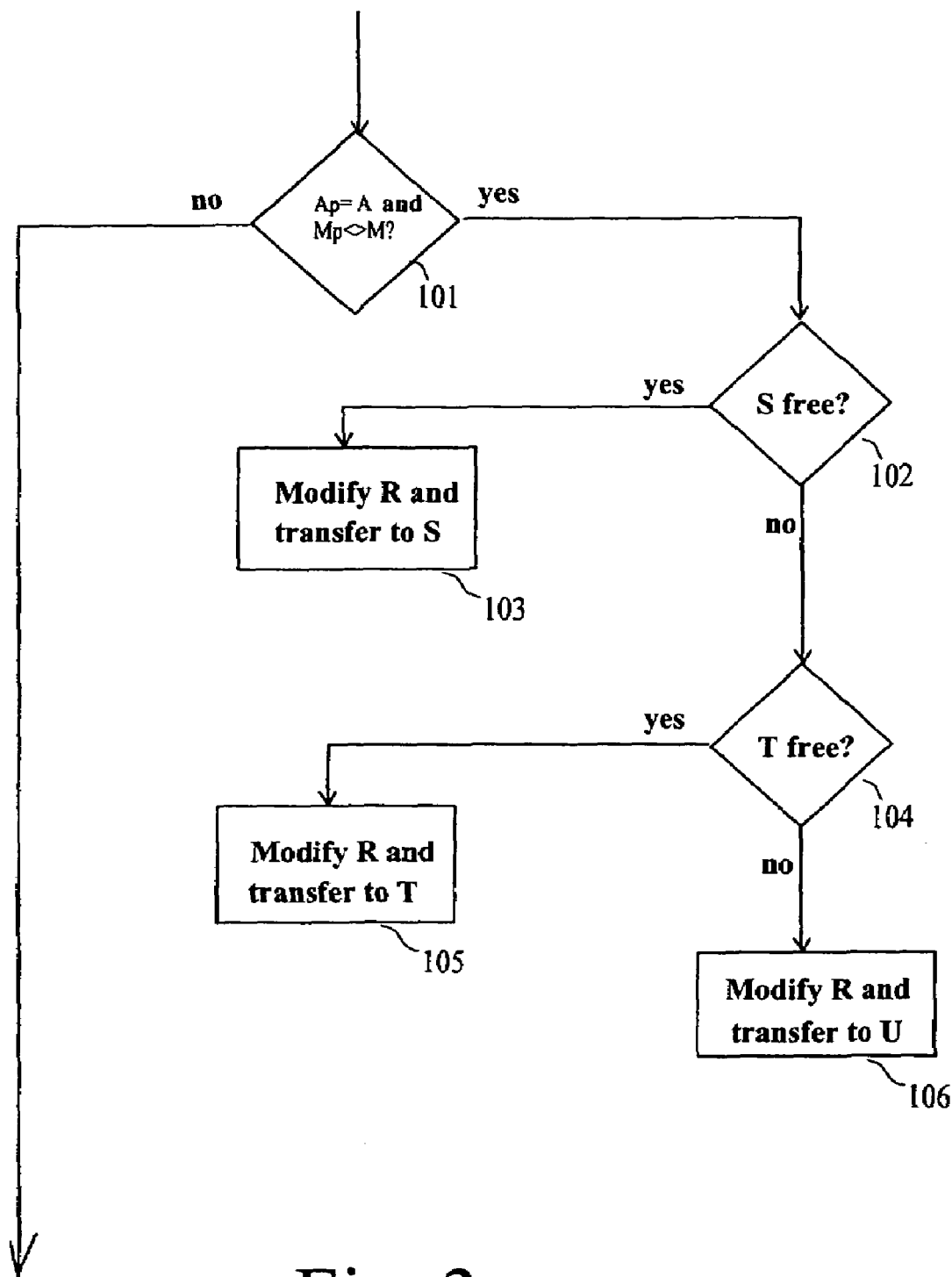
FIGS. 3 and 4 illustrate the flow chart showing the operation of the memory.
Figure 4:
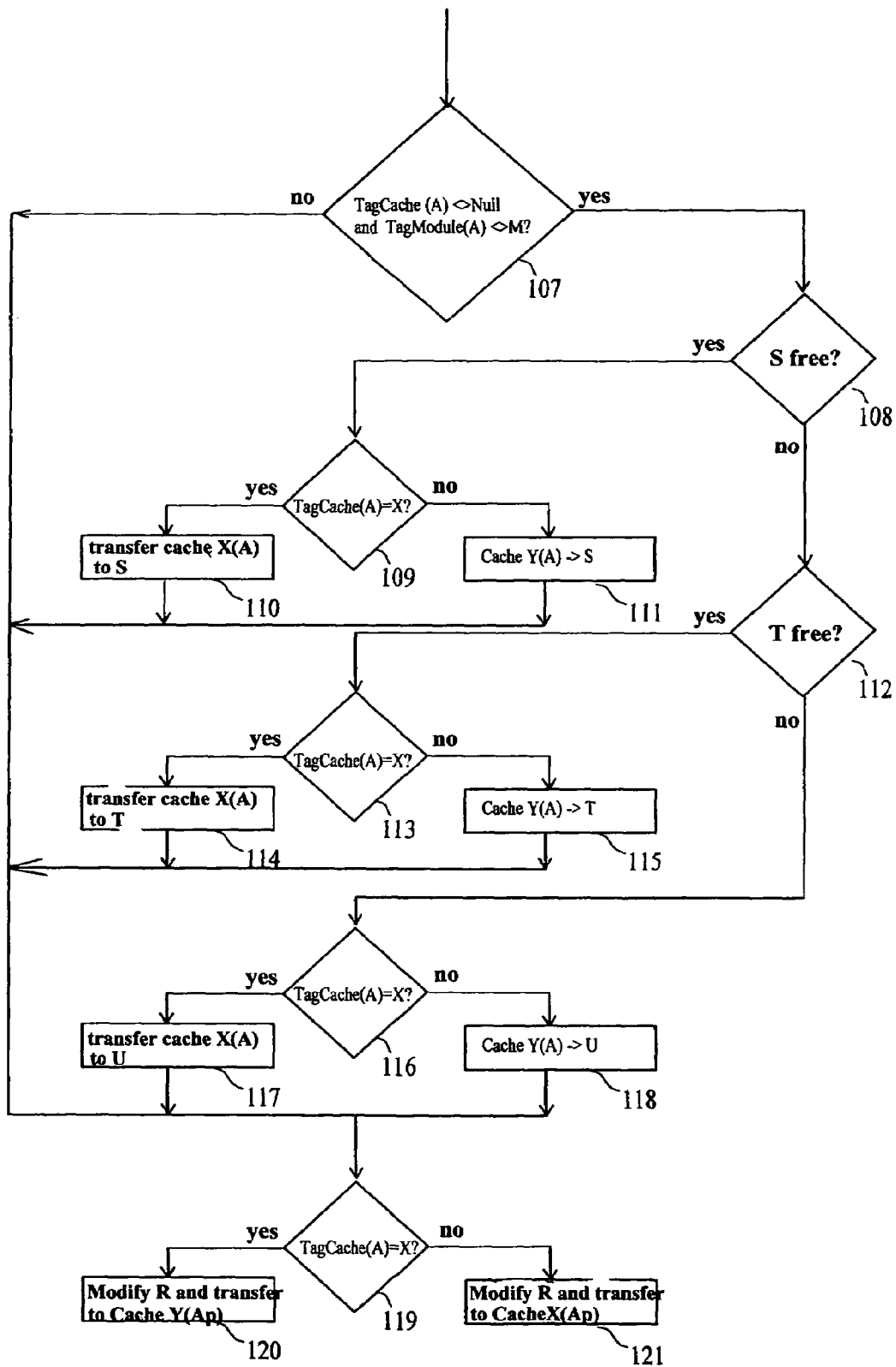

Moreover, by convention, formula "Modify R" that appears in FIGS. 3 and 4 will indicate replacement of the part of the contents of buffer R indicated by address @LSB of the preceding cycle by data (i.e., by the word) of the preceding cycle. Similarly, transfer of a buffer to the main memory or one of the caches implies preliminary computation of a new error-correcting code.

By convention, the address (@MSB and @GROUP) of the last write access having occurred before the current write access shall be noted (Mp, Ap), (these 2 accesses could be separated by several access cycles, for read operations or without any operation).

TAG memory 40 stores management information that, for each address A, specifies whether data is present in one of the two caches, and if it is the case, information necessary to rewrite data in the main memory.

If for an address A, no data is stored in any of the caches, then, by convention:

TagCache(A)==null
If data that is stored in cache 21 has an original address (M', A)—meaning that this data was extracted from module M' corresponding to a word stored at an address A within said module M', then, by convention:
TagCache(A)==X and
TagModule(A)==M'
Similarly, if data originally stored at an address (M', A) is loaded into cache 31, then:
TagCache (A)==Y and
TagModule(A)==M'

With each clock cycle where a write access is necessary, the following operations are carried out in parallel, during the cycle:

a) Rewriting, if possible, one of buffers S, T or U to the main memory according to a priority mechanism. In the preferred embodiment, the priority mechanism initially starts with the identification of which buffers S, T or U (resp. 12, 13 and 14) may be suitable for a transfer operation towards the main memory. To this end, for each buffer, it is checked whether one of the following conditions a) or b) is satisfied:

a) the buffer contains valid data belonging to a different module from the module of the data that is to be modified. In the contrary case, it means that the module in which one wishes to transfer the contents of this buffer is not available because it could be used to read the data to be modified.

b) data that is searched for is already in one of caches 21 or 31. In this case, reading the cache will be sufficient and accessing the main memory will not be necessary: it is then guaranteed that there will be no access conflict with rewriting of buffer S, T, or U (In practice, it is not essential to consider this condition.)

Once candidate buffers are identified, the process determines the particular buffer that will be selected for the actual transfer. If two candidate buffers store a value belonging to the same module, then the selected buffer will be one of them. Thus, if during identification, the process determined that S, T and U are candidates for a transfer, and that the first two buffers contain data of the same module of the main memory, then the process will purge buffer S by causing transfer of its contents to this module of the main memory.

b) Saving the contents of buffer R after modification with data of the preceding cycle to be written and purging the cache, before storing new data at the next cycle This operation will be more particularly described referring to FIGS. 3 and 4.

c) Transferring the data to be modified in buffer R.

To this end, TAG memory 40 is searched to extract information and the data to be modified can be taken at the last updated location, namely buffer R, S, T, U, or one of caches 21 or 31, or main memory 1-1 to 1-$n$. It is observed that if the required group of words was already stored in buffer R 8, then the requested modification is performed (write request of the preceding cycle). This operation can be performed by means of multiplexer 16 that allows to connect its first input receiving the output of block 9 to multiplexer 7.

d) Writing input data and address "@LSB" (the last two bits) in buffer 10 in order to be allowed to modify the group of words at the next cycle.

It will be further noted that TAG memory 40—storing values TagCache(A), TagModule(A), Tag(Ap) and the various states (validity, address and module) of the contents of buffers R, S, T and U—is updated in accordance with the transfers performed during the cycle.

FIGS. 3 and 4 more particularly illustrate buffer R saving process after modification of the data of the preceding cycle to be written and cache purging.

The process starts with step 101 during which a test determines if Ap is equal to A and if Mp is different from M.

If the data contained in R corresponds to the same address A but to a different module from the module of the data to be modified, the process does not save R to cache, because it would be overwritten at the following clock cycle; the contents of buffer R are directly saved to one of buffers S, T, or U. To this end, the process continues with step 102 or a test is performed to determine if buffer S is free.

If buffer S is free, then the process continues with step 103 where control logic 30 causes the contents of buffer R to be modified with the word of the preceding cycle, then the new group of words to be stored to buffer S. Address (Mp, Ap) is also stored in buffer 17—since it is assumed that data [Mp, Ap] is in buffer R 8 when the current data (M,A) must be processed.

If the test of step 102 fails, then the process determines in step 104 if buffer T is free, in which case, the process continues with step 105.

In step 105 control logic 30 causes the modification of buffer R with the word of the preceding cycle, then store the new group of words in buffer T. Like previously, the contents of buffer 18 are modified with the corresponding value (Mp, Ap).

If the test of step 104 fails, it means that both buffers S and T are already used and then the process continues with step 106 during which it causes the modification of buffer R, and storage of the new resulting group of words in buffer U. Indeed, as will be seen, one of the surprising effects of the method shown in FIGS. 3-4 is to guarantee that buffer U is free when both buffers S and T are not available.

If the test of step 101 fails, then the process continues with step 107 represented in FIG. 4 where a new test is performed to determine if TagCache (A) is different from NULL and if, at the same time TagModule(A) is different from M.

If the test of step 107 fails—meaning that one of the equalities is true—then the process continues directly with step 119. It will be noted in particular that if TagCache=NULL, it means that both memories 21 and 31 are empty at address A and it is not necessary to save this cache. If, at address A, the cache contains data from the same module that the current data, it means that the cache contains the required data and it is not necessary to save it elsewhere. It will simply be transferred during step c previously described.

If the test of step 107 succeeds, it means that the cache (21 or 31 according to the value—X or Y—returned by TAG memory 40) contains data from a module different from M, at the considered address A. This value is saved to S, T or U according to case's and the process described below. In parallel, the other cache is then used to save the contents of buffer R, at address Ap since this address corresponds to the address of the data read at the preceding cycle. It is noted that it is possible to access simultaneously both caches 21 and 31 that are both single port memories.

Referring again to FIG. 4, if the test of step 107 succeeds, then the process continues with step 108 during which a test is performed to determine if buffer S is free, in which case the process goes to step 109.

In step 109 the value of TagCache(A) is checked. If it is equal to X—meaning that the data is stored in cache 21—then process continues with step 110 where the contents of cache X(A) are transferred in buffer S. The process then continues with step 119.

If the value of TagCache(A) is not equal to X, then the process continues with step 111 where the contents of cache Y(A) are transferred to buffer S. The process then continues with step 119.

If the test of step 108 showed that buffer S was not available, then the process continues with step 112 during which the availability of buffer T is checked.

If buffer T is free, then the process continues with step 113 where the value of TagCache(A) is checked. If it is equal to X—meaning that the data is stored in cache 21—then process continues with step 114 where the contents of cache X(A) are transferred to buffer T. The process then continues with step 119.

If the value of TagCache(A) is not equal to X, then the process continues with step 115 where the contents of cache Y(A) are transferred to buffer T. The process then continues with step 119.

If buffer T is not free at step 112, then the process continues with step 116 where the value of TagCache(A) is compared with X.

If the value of TagCache(A) is equal to X, then in step 117 cache X(A) is transferred to buffer U. The process then continues with step 119.

If the value of TagCache(A) is not equal to X, then the process continues with step 118 where the contents of cache Y(A) are transferred to buffer U. The process then continues with step 119.

In step 119, the value of TagCache(A) is compared with X.

If both values are equal, then in step 120, the contents of buffer R are modified, a new error-correcting code is computed via block 11 and finally the contents are transferred to cache 31 at address Ap.

If the value of TagCache(A) is not equal to X, then the process continues with step 121 where the contents of buffer R are modified, the new correction code is computed and finally the resulting value is transferred to cache X(Ap), i.e., cache 21.

As can be seen, buffers S, T, and U can at no time contain data belonging to the same module:

Indeed, if 2 of these buffers contain data belonging to the same module M, and data belonging to said module M is transferred to the third buffer, it means that data belonging to a module M' different from M is being read; otherwise, it would mean that the required data is the one that is wanted for transfer: then there would be no transfer to buffers S, T or U, but instead to buffer R. Therefore, if data belonging to module M is transferred to the third buffer, it is possible to transfer the contents of one of the 2 other buffers to the main memory. Since buffers that contain data belonging to the same module as data of another buffer have priority for rewriting in the main memory, it is the action that will be performed.

Since S, T and U cannot contain data belonging to the same module, whatever data is read in the main memory, if the 3 buffers are occupied, there is always a way to rewrite one of these buffers in the main memory in parallel with the reading operation.

Thus, each time that it is necessary to transfer data to buffer S, T or U, there is always one buffer that is available.

Thus, it is never necessary to suspend reading, writing, or partial writing to the memory.

This system thus allows a continuous data stream.

Memory Read Access

When read access is required, the information contained in TAG memory 30, and the information contained in buffers 17, 18 and 19 (defining the addresses of the data stored in buffers S, T and U respectively) allow control logic 30 to determine where is the latest updated data to consider. This data can be read, corrected and provided to memory system interface.

Thus, as can be seen, with two caches 21 and 31—that can be reduced to a single cache of dual port type—combined with buffers 13, 14 and 15, write access, with error correction, can be guaranteed at each clock cycle.

It is thus noted that modules 1-1 to 1-n—although each of single port type—nevertheless allow an uninterrupted stream of data, for reads as well as for writes, while ensuring an error-correcting process within the memory. This is due to the combination of both caches allowing rewriting and simultaneous reading that is necessary for error correction.

As there are 2 caches whatever the number of memory modules, an advantage is obtained regarding speed for a low cost. [Note: each cache has exactly the same structure, and thus the same surface as a memory module]. Above a certain storage capacity, the cost of this system can even be lower than that of a simple memory where 32-bit words are corrected directly by an ECC code, because the cost of both caches can be offset by the lower number of bits of the ECC code required by ECC protection of 128-bit words.

Thus it is observed, and this is not one of the lesser advantages of the new proposed architecture, that the DRAM memory has a very simple interface for the user, close to that of a SRAM.

It should be noted that the system of the invention could also be applied to an SRAM architecture and would then allow to significantly improve their reliability.

Hereafter is a C code example for illustrating a mode of implementation of the invention:

```c
/***************************************************************************/
#include <stdio.h>
struct memory_state {
        int mem[8][128];                /* memory array [module][address] */
        int cache[2][128];              /* cache array [0 or 1][one entry per address in a module] */
        int tag_cache_valid[128];       /* indicates in which of the 2 caches is stored the data if any */
        int cache_module[128];          /* indicates to which module belongs the data stored in cache */
        int buffer_R;                   /* buffer_R's contents (data) */
        int buffer_S
        int buffer_T
        int buffer_U
        int buffer_R_valid;             /* indicates if buffer_R contains a valid data */
        int buffer_R_module;            /* module to which buffer_R's contents belongs to */
        int buffer_R_address;           /* buffer_R's contents address (inside module) */
        int buffer_S_valid;
        int buffer_S_module;
        int buffer_S_address;
        int buffer_T_valid;
        int buffer_T_module;
        int buffer_T_address;
        int buffer_U_valid;
        int buffer_U_module;
        int buffer_U_address;
        int data_buffer
        };
main( ) {
FILE *pfile;
char control;
int i, j, module, address, data, report first_error_tag, error_cycle;
int error_nb = 0;
char poubelle[80];
struct memory_state state;
        /* System intialization */
        for(j=0; j<128; j++) {
                for(i=0; i<8; i++) { state.mem[i][j] = 0;}
                state.cache[0][j] = 0;
                state.cache[1][j] = 0;
                state.tag_cache_valid[j] = 2;
                state.cache_module[j] = 0;
                state.buffer_R = 0;
                state.buffer_S = 0;
                state.buffer_T = 0;
                state.buffer_U = 0;
                state.buffer_R_valid = 0;
                state.buffer_R_module = 0;
                state.buffer_R_address = 0;
                state.buffer_S_valid = 0;
                state.buffer_S_module = 0;
                state.buffer_S_address = 0;
                state.buffer_T_valid = 0;
                state.buffer_T_module = 0;
                state.buffer_T_address = 0;
                state.buffer_U_valid = 0;
                state.buffer_U_module = 0;
                state.buffer_U_address = 0;
                state.data_buffer = 0;
        }
        pfile=fopen("control_file.txt", "r");
        fgets(poubelle, 80, pfile);
        i=0;
        while (fscanf(pfile, "%c %d %d %d\n", &control, &module, &address, &data) != EOF) {
                printf("\nCycle %d, control= %c, module= %d, address= %d, data= %d\n",
                        i, control, module, address, data);
                report = mem_access(i++, &state, control, module, address, data);
                if (report) {
                        error_nb++;
                        if (error_nb == 1) {
                                first_error_tag = report;
                                error_cycle = i-1;
                                printf("\n\nEND: Error number %d at cycle %d\n\n\n",
                                        error_nb, error_cycle);
                                return;
                        }
                }
                /*if (report) { error_nb++; last_error_tag = report; error_cycle = i-1; }*/
        }
        fclose(pfile);
        if (error_nb) {
                printf ("\n\nEND: %d errors. First error number = %d at cycle %d\n\n\n",
```

```
                                error_nb, first_error_tag, error_cycle);
        } else {
                printf("\n\nEND ! No error\n\n\n");
        };
}
mem_access(cycle, pstate, control, module, address, data)
struct memory_state *pstate;
char control;
int cycle, module, address, data;
{
int data_out, tag, tag_bag
int buffer_R_module = pstate->buffer_R_module;
int buffer_S_module = pstate->buffer_S_module;
int buffer_T_module = pstate->buffer_T_module;
int buffer_U_module = pstate->buffer_U_module;
int buffer_R_address = pstate->buffer_R_address;
int buffer_S_address = pstate->buffer_S_address;
int buffer_T_address = pstate->buffer_T_address;
int buffer_U_address = pstate->buffer_U_address;
int buffer_R = pstate->buffer_R;
int buffer_S = pstate->buffer_S;
int buffer_T = pstate->buffer_T;
int buffer_U = pstate->buffer_U;
int buffer_R_valid = pstate->buffer_R_valid;
int buffer_S_valid = pstate->buffer_S_valid;
int buffer_T_valid = pstate->buffer_T_valid;
int buffer_U_valid = pstate->buffer_U_valid;
int data_buffer = pstate->data_buffer;
int cache_module = pstate->cache_module[address];
char S_can_be_WB, T_can_be_WB, U_can_be_WB;
int error_tag = 0;
int new_data_in_cache = 0;
int R_stored_in_S = 0;
int R_stored_in_T = 0
int R_stored_in_U = 0;
tag = pstate->tag_cache_valid[address];
new_data_in_cache = 0;
if (control == 'R') {
    /* Read operation */
    /******************/
    if ((buffer_R_valid) && (buffer_R_module == module)
        && (buffer_R_address == address)) {
            /* The data is still in Buffer_R: Modification to be done now with the data
               to be written. Caution: this test first because other conditions might
               also be true */
            data_out = (pstate->buffer_R &0xFF00) | data_buffer;
    } else if ((buffer_S_valid) && (buffer_S_module == module)
        && (buffer_S_address == address)) {
            /* The data is still in Buffer_S: */
            data_out = pstate->buffer_S;
    } else if ((buffer_T_valid) && (buffer_T_module == module)
        && (buffer_T_address == address)) {
            /* The data is still in Buffer_T: */
            data_out = pstate->buffer_T;
    } else if ((buffer_U_valid) && (buffer_U_module == module)
        && (buffer_U_address == address)) {
            /* The data is still in Buffer_U: */
            data_out = pstate->buffer_U;
    } else if ((pstate->tag_cache_valid[address] == 0) && (cache_module == module)) {
            /* The data in cache 0 at required address is the searched one */
            data_out = pstate->cache[0][address];
    } else if ((pstate->tag_cache_valid[address] == 1) && (cache_module == module)) {
            /* The data in cache 1 at required address is the searched one */
            data_out = pstate->cache[1][address];
    } else {
            /* The data is in the main memory */
            data_out = pstate->mem[module][address];
    };
    printf("Cycle %d : Read %d at address %d:%d\n\n", cycle, data_out module, address);
    if (data_out != data) {
            printf("\n\n\t\t\tREAD ERROR !!! should read %d\n\n", data);
            error_tag = 2;
    };
} else if (control == 'W') {
    /* Write Operation */
    /******************/
    /* Write-back Buffer_S, T, or U: possible if no access to current module */
    /***********************************************************************/
    if ((buffer_S_valid) && (buffer_S_module != module)) {
```

```
        /* Buffer_S contains a data belonging to a module different to the current
            one; no access to the module buffer_S's data belongs to is made: buffer_S can then
            been written-back */
        S_can_be_WB = 1;
} else {S_can_be_WB = 0;};
if ((buffer_T_valid) && (buffer_T_module != module)) {
        T_can_be_WB = 1;
} else {T_can_be_WB = 0;};
if ((buffer_U_valid) && (buffer_U_module != module)) {
        U_can_be_WB = 1;
} else {U_can_be_WB = 0;};
if (S_can_be_WB && T_can_be_WB && U_can_be_WB) {
        /* If all buffers can be written-back, priority is to buffers containing data
            belonging to the same module as another buffer */
        if((buffer_S_module == buffer_T_module) || (buffer_S_module == buffer_U_module)) {
                /* Choose Buffer_S */
                pstate->mem[buffer_S_module][buffer_S_address] = pstate->buffer_S;
                pstate->buffer_S_valid = 0;
        } else if (buffer_T_module == buffer_U_module) {
                /* Choose Buffer_T */
                pstate->mem[buffer_T_module][buffer_T_address] = pstate->buffer_T;
                pstate->buffer_T_valid = 0; /* means empty */
        } else {
                /* Buffers contain data belonging to different modules: choose Buffer_S */
                pstate->mem[buffer_S_module][buffer_S_address] = pstate->buffer_S;
                pstate->buffer_S_valid = 0;
        };
} else {
        /* At least one buffer cannot be written-back; choose any buffer that can
            be written back */
        if (S_can_be_WB) {
                /* Choose Buffer_S */
                pstate->mem[buffer_S_module][buffer_S_address] = buffer_S;
                pstate->buffer_S_valid = 0;
        } else if (T_can_be_WB) {
                /* Choose Buffer_T */
                pstate->mem[buffer_T_module][buffer_T_address] = buffer_T;
                pstate->buffer_T_valid = 0;
        } else if (U_can_be_WB) {
                /* Choose Buffer_U */
                pstate->mem[buffer_U_module][buffer_U_address] = buffer_U;
                pstate->buffer_U_valid = 0;
        } else {
                /* No Write-back operation to do */
        };
};
/* Save buffer_R */
/*****************/
        /* Buffer_R is to be downloaded in the cache not already in use, if any;
            otherwise, in 0 */
        if (pstate->tag_cache_valid[address] == 0) {
                tag_bar = 1;
        } else {
                tag_bar = 0;
        };
/* Save Buffer_R in S, T, or U if it is to be erased next cycle */
/*************************************************************/
if ((buffer_R_valid) && (buffer_R_address == address) &&
    (buffer_R_module != module)) {
        /* Buffer_R's contents belongs to the same address as the current data, but not
            to the same module; it must not be written in cache, but directly in
            Buffer_S, T, or U; otherwise, it would be erased next clock cycle by the
            current data */
        if (!(pstate->buffer_S_valid)) {
            /* Note: buffer_S state to be taken into account is the one
                after the decision to write-back or not its previous contents,
                not the one of the beginning of the cycle */
            pstate->buffer_S (buffer_R & 0xFF00) | data_buffer;
            pstate->buffer_S_module = buffer_R_module;
            pstate->buffer_S_address = buffer_R_address;
            pstate->buffer_S_valid = 1;
            R_stored_in_S = 1;
            /* Note that buffer_R is free */
            pstate->buffer_R_valid = 0;
        } else if (!(pstate->buffer_T_valid)) {
            pstate->buffer_T = (buffer_R & 0xFF00) | data_buffer;
            pstate->buffer_T_module = buffer_R_module;
            pstate->buffer_T_address = buffer_R_address;
            pstate->buffer_T_valid = 1;
```

```
                R_stored_in_T = 1;
                /* Note that buffer_R is free */
                pstate->buffer_R_valid = 0;
        } else if (!(pstate->buffer_U_valid)) {
                pstate->buffer_U = (buffer_R & 0xFF00) | data_buffer;
                pstate->buffer_U_module = buffer_R_module;
                pstate->buffer_U_address = buffer_R_address;
                pstate->buffer_U_valid = 1;
                R_stored_in_U = 1
                /* Note that buffer_R is free */
                pstate->buffer_R_valid = 0;
        } else {
                /* It is not (should not be ?) possible that all buffers
                        are occupied at that time */
                printf("\n\n\t\tERROR: cycle %d: no back-up of Buffer_R possible
                        because Buffers S, T and U are all occupied !\n\n\n", cycle,
                        pstate->tag_cache_valid[address],
                        address):
                        error_tag = 1;
                };
        } else {
                /* Free cache if needed */
                /************************/
                if ((pstate->tag_cache_valid[address] <2) && (cache_module != module)) {
                        /* there is a data in one of the caches, and it is not the data to be modified;
                           it must be freed because a data will be stored in it in the next access */
                        if (!(pstate->buffer_S_valid)) {
                                pstate->buffer_S = pstate->cache[pstate-
>tag_cache_valid[address]][address];
                                pstate->buffer_S_module = pstate->cache_module[address];
                                pstate->buffer_S_address = address;
                                pstate->buffer_S_valid = 1;
                                /* Note that cache[address] is free */
                                pstate->tag_cache_valid[address] = 2;
                        } else if (!(pstate->buffer_T_valid)) {
                                pstate->buffer_T = pstate->cache[pstate-
>tag_cache_valid[address]][address];
                                pstate->buffer_T_module = pstate->cache_module[address];
                                pstate->buffer_T_address = address;
                                pstate->buffer_T_valid = 1;
                                /* Note that cache[address] is free */
                                pstate->tag_cache_valid[address] =2;
                        } else if (!(pstate->buffer_U_valid)) {
                                pstate->buffer_U = pstate->cache[pstate-
>tag_cache_valid[address]][address];
                                pstate->buffer_U_module = pstate->cache_module[address];
                                pstate->buffer_U_address = address;
                                pstate->buffer_U_valid = 1;
                                /* Note that cache[address] is free */
                                pstate->tag_cache_valid[address] = 2;
                        } else {
                                /* It is not (should not be ?) possible that all buffers
                                   are occupied at that time */
                                printf("\n\n\t\tERROR: cycle %d: no back-up of cache[%d][%d] possible
                                        because Buffers S, T and U are all occupied !\n\n\n", cycle,
                                pstate->tag_cache_valid[address],
                                address);
                                error_tag = 1;
                        };
                };
                /* Write Buffer_R in cache */
                /***************************/
                /* store buffer_R's contents modified by data_buffer into cache tag_bar, except
                if it contains the data currently being addressed.
                For simplicity, it is assumed only the LSByte is modified every write cycle */
                if ((buffer_R_valid) && !((buffer_R_address == address) && (buffer_R_module == module)))
{
                        pstate->cache[tag_bar][buffer_R_address] = (buffer_R & 0xFF00) |data_buffer;
                        pstate->cache_module[buffer_R_address] = buffer_R_module;
                        pstate->buffer_R_valid = 0;
                        new_data_in_cache = 1;
                        /* We should note that cache[tag_bar][buffer_R_address] is occupied.
                           However, we still need the current value of tag_cache_valid; it will be
                           updated in the "Read data . . . " section, after we do not need it any more */
                }
        };
        /* Read data and store it in Buffer_R */
        /**************************************/
        if ((buffer_R_valid == 1) && (buffer_R_module == module) &&
```

```
            (buffer_R_address == address)) {
                /* The data is in buffer_R */
                /* store buffer_R's content modified by data_buffer into buffer_R
                   For simplicity, it is assumed only the LSByte is modified every write cycle */
                pstate->buffer_R = (buffer_R & 0xFF00) | data_buffer;
        } else if ((buffer_S_valid == 1) && (buffer_S_module == module) &&
           (buffer_S_address == address)) {
                /* The data is in buffer_S */
                pstate->buffer_R = buffer_S;
                if (!(R_stored_in_S)) {
                        /* Buffer_S will be modified: do not save it! */
                        pstate->buffer_S_valid = 0;
                };
        } else if ((buffer_T_valid == 1) && (buffer_T_module == module) &&
           (buffer_T_address == address)) {
                /* The data is in buffer_T */
                pstate->buffer_R = buffer_T;
                if (!(R_stored_in_T)) {
                        /* Buffer_T will be modified: do not save it! */
                        pstate->buffer_T_valid = 0;
                }
        } else if ((buffer_U_valid == 1) && (buffer_U_module == module) &&
           (buffer_U_address == address)) {
                /* The data is in buffer_U */
                pstate->buffer_R = buffer_U;
                if (!(R_stored_in_U)) {
                        /* Buffer_U will be modified: do not save it! */
                        pstate->buffer_U_valid = 0;
                };
        } else if ((pstate->tag_cache_valid[address] < 2) && (cache_module == module)) {
                /* There is already a valid data in cache at address "address",
                   and this data belongs to the same module as the one being addressed:
                   it means the data being addressed is actually in cache, not
                   in memory */
                /* Read the data in the valid cache */
                pstate->buffer_R = pstate->cache[pstate->tag_cache_valid[address]][address];
                /* Note that this cache entry is not valid any more */
                pstate->tag_cache_valid[address] = 2;
        } else {
                /* The data is in memory */
                pstate->buffer_R = pstate->mem[module][address];
        };
        if (new_data_in_cache) {
                pstate->tag_cache_valid[buffer_R_address] = tag_bar;
        }
        /* Note what is registered in Buffer_R in any case */
        pstate->buffer_R_module = module;
        pstate->buffer_R_valid = 1;
        pstate->buffer_R_address = address;
        /* store data into data_buffer (to be used next clock cycle) */
        /**************************************************************/
        pstate->data_buffer = data;
}; /* end write operation */
return error_tag;
}; /* End mem_access */
```

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

From the foregoing it will be appreciated that, although specific embodiments of the invention have been described herein for purposes of illustration, various modifications may be made without deviating from the spirit and scope of the invention. Accordingly, the invention is not limited except as by the appended claims.

The invention claimed is:

1. A memory circuit, comprising:

a dual port memory circuit that includes:

a memory plane including a first module and a second module, each composed of an array of memory cells arranged in rows and columns, each row of said memory plane allowing to store a page of words, each word of said page being identified by an address organized according to a hierarchical division defined by (@MSB, row address, column address), with @MSB identifying a particular module among said modules;

a first address bus and a second address bus;

a first data bus and a second data bus used for reading and for writing in said modules respectively;

first and second multiplexers each having a first input and a second input connected to said first and second address buses respectively and also having an output;

first and second row decoders each having an input connected to the output of a respective one of said multiplexers in order to receive a row address;

a first column decoder having an input connected to the output of said first multiplexer in order to receive a column address, said first column decoder having an output connected to said first data bus;

a second column decoder having an input connected to the output of said first multiplexer in order to receive a column address, said second column decoder having an input connected to said second data bus;

a third column decoder having an input connected to the output of said second multiplexer in order to receive a column address, said third column decoder having an output connected to said first data bus;

a fourth column decoder having an input connected to the output of said second multiplexer in order to receive a column address, said fourth column decoder having an input connected to said second data bus;

first and second control circuits for controlling the first and second multiplexers, respectively, allowing each multiplexer to select one of both address buses according to the following logic:

if @MSB of said first address bus is equal to the address of said module corresponding to said multiplexer and a read/write control is present on said first bus, then the multiplexer outputs the row and column addresses and said read/write control of said first bus;

otherwise, if @MSB of said second address bus is equal to the address of said module corresponding to said multiplexer and a read/write control is present on said second bus, then the multiplexer outputs the row and column addresses of said second bus; and if the @MSB on one of the first and second address buses does equal the address of the first and second modules, then each multiplexer outputs inactive read/write controls.

2. A memory circuit according to claim 1, further comprising:

a single port memory circuit having an interface connected to said first address bus; and an error-correcting mechanism structured to internally use said second address bus and second data bus to rewrite to one of said memory modules.

3. A memory circuit according to claim 2 wherein addressing within each one of said modules is organized according to a hierarchical division @GROUP, @LSB, with @GROUP identifying one particular group of words within said particular module and @LSB defining a position of a word in said group of words, and wherein the error-correcting mechanism is structured to apply an error-correcting code to that group of words.

4. A memory circuit according to claim 3 wherein the error-correcting mechanism is applied to a subset of said page, said subset constituting a group of words, and the error-correcting mechanism comprises:

a cache memory for storing one group of words, after its possible modification, at an address having a bijective relation to the @GROUP address originally used for storage in said module;

first, second, and third buffers structured to temporarily transfer contents of said cache memory, for an @GROUP address corresponding to a next cycle in order to allow a next write access to said address;

circuits for transferring contents of one of said first, second, and third buffers, at the earliest during a successive cycle, to one of said modules that is not being read.

5. A memory circuit according to claim 4 wherein said first and second modules are single port type memories, and said bijective relation is a unit relation.

6. A memory circuit according to claim 4 wherein said cache memory is a dual port type memory.

7. A memory circuit according to claim 4 wherein said cache memory comprises a first cache and a second cache, each of single port type, and simultaneously allows write access to a group of words and read access to another group of words.

8. A memory circuit according to claim 7 wherein the single port memory circuit includes a memory for storing, for each @GROUP address of a group of words within one of said modules:

data determining whether the address corresponds to a valid group of words, namely data having been read in one of said modules, modified and not yet rewritten in this module;

data identifying a module among said modules;

data identifying which of said first and second caches is used for storing said valid data.

9. A memory circuit according to claim 8 wherein the single port memory circuit comprises means for identifying, for each read access, a location of most recently updated data stored in one of said modules, in said first or second caches, or in said buffers.

10. A memory circuit according to claim 9 wherein the error-correcting mechanism comprises:

a first error-correcting block for receiving a group of words extracted from said modules;

a buffer R for storing a read value of the group of words, before modification;

a word modifier block allowing modification of a particular word within said group of words;

an error-correcting code computation block for computing a new error-correcting code for the modified group of words, wherein the first and second caches store a result generated by said error-correcting code computation block;

a second error-correcting block for checking and, if necessary, correcting a group of words extracted from said first or second caches, wherein the first, second and third buffers store the checked and corrected group of words generated by said second error-correcting block;

multiplexing means for loading into said buffer R, a group of words extracted from the first or second caches, or from said first, second or third buffers, or from said buffer R after modification, or from one of the memory modules.

11. A memory circuit according to claim 10 wherein said multiplexing means further allow transfer of the contents of said first, second or third buffers or the contents of buffer R to one of said modules.

12. A memory circuit according to claim 11, further comprising:

a fourth buffer for storing an address corresponding to data stored in said first buffer;

a fifth buffer for storing an address corresponding to data stored in said second buffer;

a sixth buffer for storing an address corresponding to data stored in said third buffer; and second multiplexing means for transmitting said contents of said fourth, fifth and sixth buffers to the row decoders in order to allow transfer of the contents of one of said first, second or third buffers, to one of said modules.

13. A memory circuit according to claim 4 wherein a page is 1024 bits, organized in 128-bit groups of words that break down into 32-bit words.

14. A memory circuit, comprising:

first and second memory modules, each including an array of memory cells arranged in rows and columns, each row being structured to store a page of words, each word of the page being identified by an address that includes a more significant portion, identifying a particular memory module among the memory modules, and a less significant portion identifying a position of the word within the memory module;

a first address bus and a second address bus;

first and second multiplexers each having a first input and a second input connected to the first and second address buses respectively and also having an output;

a first address decoder having an input connected to the output of the first multiplexer and an output connected to the first memory module;

a second address decoder having an input connected to the output of the second multiplexer and an output connected to the second memory module;

first and second control circuits for controlling the first and second multiplexers, respectively, allowing each multiplexer to select one of the address buses according to the following logic:

if a more significant portion of an address on the first address bus identifies the memory module corresponding to the multiplexer and a read/write control is present on the first address bus, then the multiplexer outputs a less significant portion of the address to the corresponding address decoder;

if a more significant portion of an address on the second address bus identifies the memory module corresponding to the multiplexer and a read/write control is present on the second address bus, then the multiplexer outputs a less significant portion of the address to the corresponding address decoder; and if neither more significant portion of the addresses on the first and second address buses identifies the first and second memory modules, then each multiplexer outputs inactive read/write controls.

15. A memory circuit according to claim 14, further comprising:

an error-correcting mechanism structured to internally use the second address bus to rewrite to one of the memory modules.

16. A memory circuit according to claim 15 wherein each address includes a group address portion identifying one particular group of words within the particular module, wherein the error-correcting mechanism is structured to apply an error-correcting code to the group of words.

17. A memory circuit according to claim 16 wherein the error-correcting mechanism comprises:

a cache memory for storing one group of words, after its possible modification, at an address having a bijective relation to a group address portion originally used for storing the group of words in one of the modules;

first, second, and third buffers structured to temporarily transfer contents of the cache memory, for a group address portion corresponding to a next cycle in order to allow a next write access to the group address portion;

means for transferring contents of one of the first, second, and third buffers, at the earliest during a successive cycle, to one of the modules that is not being read.

18. A memory circuit according to claim 17 wherein the cache memory comprises a first cache and a second cache that simultaneously allowing write access to a group of words and read access to another group of words.

19. A memory circuit according to claim 18, further comprising a memory for storing, for each group address portion of a group of words within one of the modules:

data determining whether the group address portion corresponds to a valid group of words, namely data having been read in one of the modules, modified and not yet rewritten in this module;

data identifying a module among the modules; and data identifying which of the first and second caches is used for storing the valid data.

20. A memory circuit according to claim 17 wherein the error-correcting mechanism comprises:

a first error-correcting block for receiving a group of words extracted from the modules;

a buffer R for storing a read value of the group of words, before modification;

a word modifier block allowing modification of a particular word within the group of words;

an error-correcting code computation block for computing a new error-correcting code for the modified group of words, wherein the first and second caches store a result generated by the error-correcting code computation block;

a second error-correcting block for checking and, if necessary, correcting a group of words extracted from the first or second caches, wherein the first, second and third buffers store the checked and corrected group of words generated by the second error-correcting block;

multiplexing means for loading into the buffer R, a group of words extracted from the first or second caches, or from the first, second or third buffers, or from the buffer R after modification, or from one of the memory modules.

21. A memory circuit according to claim 20 wherein the multiplexing means further allow transfer of the contents of the first, second or third buffers or the contents of buffer R to one of the modules.

22. A memory circuit according to claim 14, wherein the first address decoder includes a row address decoder and a column address decoder each having an input connected to the output of the first multiplexer and the second address decoder includes a row address decoder and a column address decoder each having an input connected to the output of the second multiplexer.

23. A method of accessing a memory circuit that includes first and second memory modules, each including an array of memory cells arranged in rows and columns, each row being structured to store a page of words, each word of the page being identified by an address that includes a more significant portion and a less significant portion, the method comprising:

receiving a first address from a first address bus;

determining whether a more significant portion of the first address identifies one of the first and second memory modules;

if the determining step determines that the more significant portion of the first address identifies the first memory module, then enabling access to the first memory module at a position identified by a less significant portion of the first address;

if the determining step determines that the more significant portion of the first address identifies the second memory module, then enabling access to the second memory module at a position identified by the less significant portion of the first address;

receiving a second address from a second address bus;

determining whether a more significant portion of the second address identifies one of the first and second memory modules;

if the determining step determines that the more significant portion of the second address identifies the first memory module, then enabling access to the first memory module at a position identified by a less significant portion of the second address;

if the determining step determines that the more significant portion of the second address identifies the second memory module, then enabling access to the second memory module at a position identified by the less significant portion of the second address;

if neither more significant portion of the addresses on the first and second address buses identifies one of the first and second memory modules, disabling access to the first and second memory modules.

24. The method of claim 23, further comprising:
using the second address bus to implement error correction on both of the first and second memory modules.

25. The method of claim 23 wherein each address includes a group address portion identifying one particular group of words within the particular module, the method further comprising using the second address bus to apply an error correction code to the group of words.

* * * * *